United States Patent

Cronin et al.

[11] Patent Number: 5,773,361
[45] Date of Patent: Jun. 30, 1998

[54] PROCESS OF MAKING A MICROCAVITY STRUCTURE AND APPLICATIONS THEREOF

[75] Inventors: John Edward Cronin, Milton; Anthony Kendall Stamper, Williston, both of Vt.

[73] Assignee: International Business Machines Corporation, Armonk, N.Y.

[21] Appl. No.: 744,473

[22] Filed: Nov. 6, 1996

[51] Int. Cl.[6] .......................... H01L 21/88; H01L 21/94
[52] U.S. Cl. ................... 438/637; 438/702; 438/700
[58] Field of Search ............................ 437/240, 982, 437/236, 235, 238, 195; 438/783, 784, 624, 631, 632, 699, 637, 702, 700, 701, 698, 118

[56] References Cited

U.S. PATENT DOCUMENTS

| | | | |
|---|---|---|---|
| 4,474,831 | 10/1984 | Downey | 437/982 |
| 4,781,945 | 11/1988 | Nishimura et al. | 437/240 |
| 4,835,597 | 5/1989 | Okuyama et al. | 257/634 |
| 4,962,063 | 10/1990 | Maydan et al. | 437/240 |
| 5,004,704 | 4/1991 | Maeda et al. | 437/195 |
| 5,094,984 | 3/1992 | Liu et al. | 437/982 |
| 5,119,164 | 6/1992 | Silwa, Jr. et al. | |
| 5,188,987 | 2/1993 | Ogino | 437/235 |
| 5,192,715 | 3/1993 | Silwa, Jr. et al. | |
| 5,204,288 | 4/1993 | Marks et al. | 437/240 |
| 5,244,841 | 9/1993 | Marks et al. | |
| 5,250,472 | 10/1993 | Chen et al. | |
| 5,268,333 | 12/1993 | Lee et al. | 437/240 |
| 5,278,103 | 1/1994 | Mallon et al. | 437/240 |
| 5,310,700 | 5/1994 | Lien et al. | 437/195 |
| 5,444,026 | 8/1995 | Kim et al. | 437/240 |
| 5,508,234 | 4/1996 | Dusablon et al. | |
| 5,518,962 | 5/1996 | Murao | 437/195 |
| 5,641,712 | 6/1997 | Grivna et al. | 438/624 |

FOREIGN PATENT DOCUMENTS

| | | | |
|---|---|---|---|
| 62-144342 | 6/1987 | Japan | 437/982 |

OTHER PUBLICATIONS

Wolf, Stanley *Silicon Processing For The VLSI Era*, vol. 2, p. 333 (1990).

*Primary Examiner*—Charles L. Bowers, Jr.
*Assistant Examiner*—Matthew Whipple
*Attorney, Agent, or Firm*—Schmeiser, Olsen & Watts; Mark F. Chadurjian

[57] ABSTRACT

A microcavity structure and a method for forming an integrated circuit device including a microcavity structure is disclosed. This invention includes a layer or substrate having a topography such as a pair of raised features. A void forming material, such as a Boro-Phosphorus Silicate Glass (BPSG) is deposited on the substrate such that a void is formed therein. A pinning material having a relatively greater density than the void forming material is deposited over the void forming material. The materials are then annealed by a process such as Rapid Thermal Anneal (RTA). The materials are then polished, by for example, Chemical Mechanical Polishing (CMP) to expose the top of the void. The void is then etched using an anisotropic etch, such as Reactive Ion Etch (RIE) to remove the void forming material. The method may be used to provide self-aligned contact vias.

14 Claims, 1 Drawing Sheet

PROCESS OF MAKING A MICROCAVITY STRUCTURE AND APPLICATIONS THEREOF

BACKGROUND OF THE INVENTION

1. Technical Field

This invention relates to integrated circuit devices and a process of making the same, and in particular, this invention relates to microcavity structures which utilize a pinning layer to pin the microcavity structures in selected areas, applications thereof and process of making the same.

2. Background

As integrated circuit devices become smaller, spacing between electronic components and conductors becomes ever more critical. Such components and/or conductors are typically separated and isolated by a dielectric material. A vacuum has the best relative dielectric constant (1.0). The dielectric constant of air is just slightly higher than that of a vacuum.

Doped glass is commonly used as an integrated circuit dielectric because its melting point can be made significantly lower than that of regular glass or of other dielectric materials. Boro-Phosphorus Silicate Glass (BPSG) is one exemplary type of doped glass. After deposition over a pattern of polysilicon conductors, for example, a relatively rough BPSG dielectric layer can be put through a high temperature reflow process, usually at about 900° C., which reflows the BPSG and smooths its surface for facilitating subsequent processing steps.

A typical BPSG material, however, has a significantly higher relative dielectric constant, e.g., about 3.6 to 3.9. One technique which has been used to reduce the relative dielectric constant of BPSG glass is to allow cavities to form in the material at appropriate locations. The cavities can form during the chemical vapor deposition (CVD) process in spaces between raised features, such as conductors or semiconductor mesas. These cavities are essentially air or vacuum filled and therefor constitute a low dielectric constant region between the structures. In this manner, for example, capacitive coupling between adjacent conductors can be reduced, thereby enhancing device signal speed.

Despite speed improvements which voids in BPSG films can provide, their proper size and shape formation is presently difficult to control. For example, voids between adjacent conductors are formed when a BPSG layer is deposited on top of a polysilicon conductive pattern. However, during the reflow process, the voids may disappear if the spaces between polysilicon conductors are large enough or the deposited film is thin enough. The voids formed when a BPSG layer of about 7000 Angstroms is deposited over a circuit topography of conductors separated by about 1.0 micron are typically eliminated during reflow. Unfortunately, it is not possible to forgo the reflow process without also losing the smoothness and related benefits such a structure can provide in subsequent processing.

Thus, as with the above-discussed example, there is a need for an improved method for controllably fabricating cavities for semiconductor and micro-machine applications, such as for pressure sensing, chromatography, fabrication of capacitive components, and selectively isolating components and conductors, etc.

SUMMARY OF THE INVENTION

Microcavity structures or voids are controlled for providing structures, such as self-aligned contact vias, by pinning a microcavity in selected areas using a pinning layer which is then selectively removed. A structure such as the contact via is formed in a method which steps include: providing a layer having a pair of raised features; depositing a void forming material over said layer; depositing a pinning material over said void forming material, wherein the pinning material acts to pin a void in said void forming material; and annealing the materials.

Another method of this invention includes the steps of: providing a substrate with topography; depositing a void forming material over said substrate to thereby form voids; depositing a pinning material over said void forming material wherein the pinning material pins the void forming material; patterning said pinning material to remove the pinning material from areas where void formation is not desired; and annealing the voids in areas where the pinning material remains to seal the void forming material in areas where the second material has been selectively removed.

The contact via and method for making the same saves both time and expense over existing methods. For example, it does not require the use of pressurizing the microcavities to prevent collapse of the microcavity structures. Another advantage is more accurate control of size, shape and location of void formation. Numerous other advantages and features of the present invention will become readily apparent from the following detailed description of the preferred embodiment, the accompanying drawings and the appended claims.

BRIEF DESCRIPTION OF THE DRAWINGS

The preferred exemplary embodiment of the present invention will hereinafter be described in conjunction with the appended drawings, where like designations denote like elements, and.

The foregoing and other objects, features and advantages of the invention will be apparent from the following more particular description of preferred embodiments of the invention.

BEST MODE FOR CARRYING OUT THE INVENTION

Various types of microcavity formation are described in detail in U.S. Pat. No. 5,508,234, which is assigned to International Business Machines Corp., and is hereby incorporated by reference.

Figure 1:
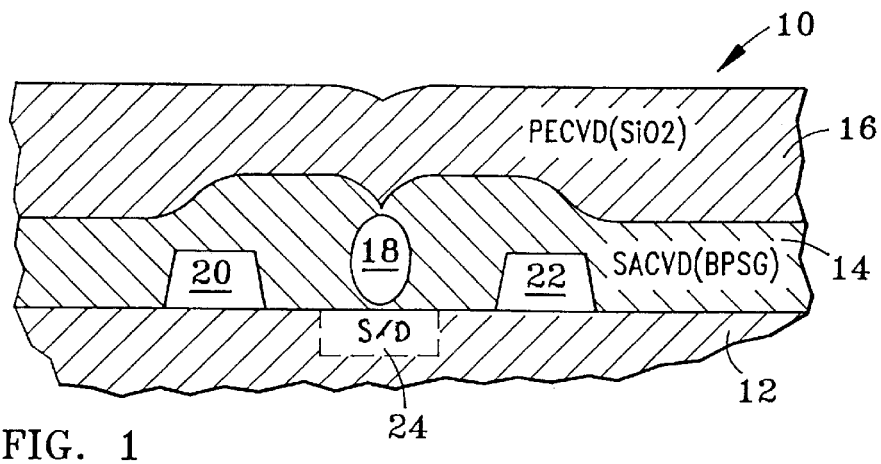
FIG. 1 is a schematic representation of a portion of an integrated circuit (IC) device structure showing a void therein.

With reference to FIG. 1, a layer 12 is provided. The layer 12 has been built up by semiconductor processing steps to include a conductor or source/drain region (S/D) 24. A plurality of raised features 20, 22, such as conductors (e.g., polylines), or semiconductor mesas, having an aspect ratio greater than 2 are then formed on layer 12. The size and shape of the raised features 20, 22 may vary depending upon the particular application and the desired size and shape of the resultant void 18. The raised features 20, 22 are formed such that a layer disposed there above would not entirely fill the space therebetween (i.e., a void would be formed). The aspect ratio/pair spacing is critical to determining where the void will form.

A layer or film 14 of material, such as a glass or more particularly Boro-Phosphorus Silicate Glass (BPSG), is deposited over the layer 12 and raised features 20, 22 by a deposition process, such as preferably Sub-atmospheric Chemical Vapor Deposition (SACVD). Other deposition processes may be used such as Plasma Enhanced Chemical Vapor Deposition (PECVD), Liquid Phase Chemical Vapor Deposition (LPCVD) or any other method used to deposit the desired material. The layer of material 14 is a relatively low density film. A void 18 is formed between the raised features 20, 22 into any desired number, shape or geometry, such as microtunnels. Preferably, the layer of material 14 is deposited to a thickness of greater than 0.5 of the space between the pair of raised features.

Care should be taken to ensure that during the anneal step that the relatively low density material 14 does not contract. During annealing the material 14 tends to contract (e.g., relatively low density BPSG tends to contract by about 3%), resulting in the void moving toward the top of a surface of the layer 14 one vacancy at a time (literally one atom at a time). This may result in the undesired effect of elimination of the void 18. Thus, in order to determine the desired void shape and geometry 18, a layer of pinning material 16 is deposited over the layer 14 before annealing. The pinning layer 16 changes the shape of the void. The preferred annealing step is a Rapid Thermal Anneal (RTA). The layer 16 is formed from a relatively high density material such as silicon dioxide ($SiO_2$), or any material which would shrink less than the layer 14 during the anneal, adheres well to the layer 14, and is fairly rigid such that it does not expand or shrink during the anneal relative to layer 14. Such materials include sputtered silicon, silicon nitride, CVD or sputtered metal. The layer 16 is deposited by a deposition process, such as Plasma Enhanced Chemical Vapor Deposition (PECVD).

Figure 2:
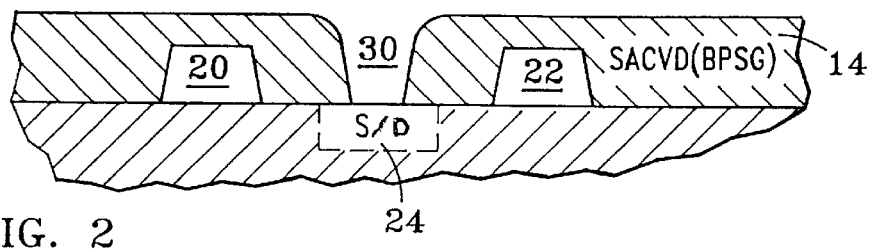
FIG. 2 is a schematic representation of a portion of an integrated circuit (IC) device after etching the void region.

Referring to FIG. 2, a self-aligned contact via 30 is shown between the raised features 20, 22.

Figure 3:
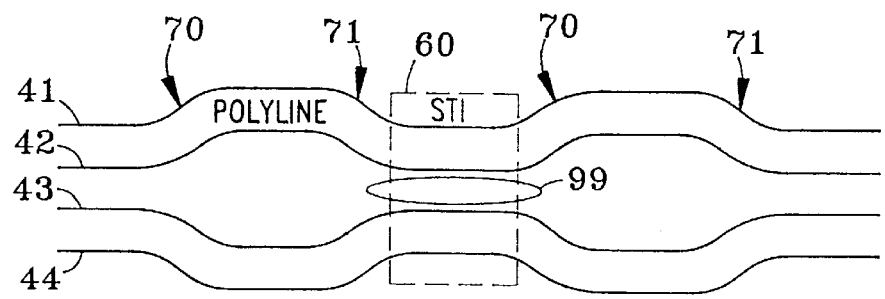
FIG. 3 is a top view of a self aligned contact via.
Figure 4:
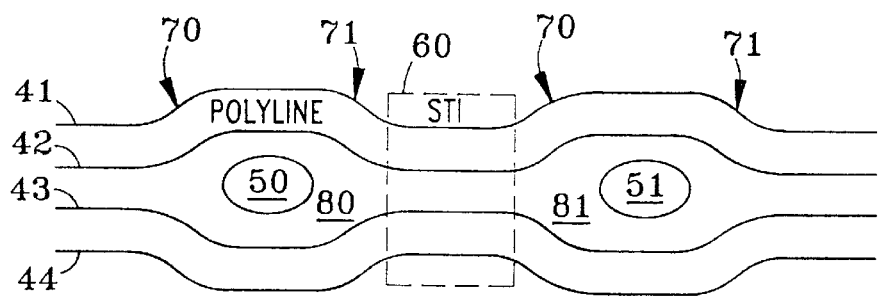
FIG. 4 SEM showing controlled void formation.

Referring to FIGS. 3 and 4, a top view of a self aligned contact via is shown. In the case of a self aligned contact via, the raised features are a word line or gate 41, 42 and 43, 44, formed from a material such as polysilicon, which form parallel lines which diverge at 70 to form a semi-circular like configuration and then converge at 71 to resume as parallel lines. If the aspect ratio is sufficiently high (2), a void is formed during BPSG deposition 99. During anneal, if a pinning layer is over the BPSG, the voids 50, 51 are formed so that they coalesce to the contact regions 80, 81. Although other techniques are contemplated, the pinning layer 16 is only on top of the contact regions 80, 81. The pinning layer 16 is lithographically patterned over the contact regions 80, 81. The material is etched through the top two layers 16, 14 down to expose the voids 50, 51, then down to the source/drain region 24.

Those skilled in the art will understand from the above discussion that many other implementations of the various applications are possible, and within the scope of the present invention as defined by the appended claims.

While the invention has been described in detail herein in accordance with certain preferred embodiments thereof, many modifications and changes therein may be effected by those skilled in the art. Accordingly, it is intended by the appended claims to cover all such modifications and changes as fall with the true spirit of the invention.

We claim:

1. A method of forming an integrated circuit device comprising the steps of:

providing a layer having a pair of raised features;

depositing a void forming material over said layer;

depositing a pinning material over said void forming material to pin a void in said void forming material;

annealing the materials; and etching to expose the void and remove the void forming material from the area between the raised features to thereby form a contact via.

2. The method of claim 1, wherein the step of providing a pair of raised features further comprises:

providing a pair of polylines.

3. The method of claim 1, wherein step of depositing the void forming material further comprises:

depositing Boro-Phosophorus Silicate Glass (BPSG) by Sub-atmospheric Chemical Vapor Deposition (SACVD).

4. The method of claim 1, wherein the step of depositing the pinning material further comprises:

depositing a pinning material which: a) shrinks less than the void forming material during the annealing step; b) adheres to the void forming material; and c) has rigidity such that it does not substantially expand or shrink during the annealing step.

5. The method of claim 4, wherein the step of depositing the pinning material further comprises:

depositing silicon dioxide by Plasma Enhanced Chemical Vapor Deposition (PECVD).

6. The method of claim 1, wherein the step of annealing the materials further comprises:

annealing using a Rapid Thermal Anneal (RTA).

7. The method of claim 1, further comprising the step of:

polishing the materials to expose the top of the void prior to etching.

8. The method of claim 7, wherein the step of polishing the materials further comprises a Chemical Mechanical Polish.

9. The method of claim 7, wherein the step of etching further comprises:

etching the void forming material above conductors to form self-aligned vias and a self-aligned contact area.

10. The method of claim 9, wherein the materials are lithographically patterned such that only the self-aligned contact area is exposed.

11. A method of forming an enlarged cavity in selected areas, said method comprising the steps of:

providing a substrate with topography;

depositing a void forming material over said substrate to thereby form voids;

depositing a pinning material over said void forming material wherein the pinning material pins a void in the void forming material;

patterning said pinning material to remove the pinning material from the areas where void formation is not desired;

annealing the voids in areas where the pinning material remains to pin the void in the void forming material; and etching through the remaining pinning material and the void forming material thereunder to expose the void and create an enlarged cavity.

12. A method for forming an integrated circuit device comprising the steps of:

providing a layer having a pair of raised features;

depositing a void forming material over said layer;

depositing a pinning material over said void forming material, wherein the pinning material acts to pin a void in said void forming material;

annealing the materials;

polishing the materials to expose the top of the void; and etching using an etch to remove the void forming material from the area between the raised features.

13. The method of claim 12, wherein the step of polishing the materials further comprises a Chemical Mechanical Polish.

14. The method of claim 12, wherein the step of etching further comprises:

etching the void forming material above conductors to form self-aligned vias.

* * * * *